United States Patent
Lucy et al.

(10) Patent No.: US 11,584,347 B2
(45) Date of Patent: Feb. 21, 2023

(54) TRAILER BATTERY REVERSE CONNECTION PROTECTION

(71) Applicant: Continental Automotive Systems, Inc., Auburn Hills, MI (US)

(72) Inventors: Scott J. Lucy, Lake Orion, MI (US); Matthew McLeod, Rochester Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 505 days.

(21) Appl. No.: 16/750,163

(22) Filed: Jan. 23, 2020

(65) Prior Publication Data

US 2021/0197781 A1 Jul. 1, 2021

Related U.S. Application Data

(60) Provisional application No. 62/954,729, filed on Dec. 30, 2019.

(51) Int. Cl.
| | |
|---|---|
| *B60L 7/00* | (2006.01) |
| *B60T 13/74* | (2006.01) |
| *B60T 8/17* | (2006.01) |
| *G01R 19/14* | (2006.01) |
| *H02H 1/00* | (2006.01) |
| *H02H 7/20* | (2006.01) |

(52) U.S. Cl.
CPC .......... *B60T 13/74* (2013.01); *B60T 8/1701* (2013.01); *G01R 19/14* (2013.01); *H02H 1/0007* (2013.01); *H02H 7/20* (2013.01)

(58) Field of Classification Search
CPC ....... B60T 13/74; B60T 8/1701; G01R 19/14; H02H 1/0007; H02H 7/20
USPC ...................................................... 188/158
See application file for complete search history.

(56) References Cited

U.S. PATENT DOCUMENTS

| | | | |
|---|---|---|---|
| 3,574,414 A * | 4/1971 | Jacob | B60T 13/74 303/3 |
| 4,856,850 A * | 8/1989 | Aichele | B60T 13/662 303/20 |
| 5,517,379 A | 5/1996 | Williams et al. | |
| 6,437,957 B1 | 8/2002 | Karuppana et al. | |
| 6,837,551 B2 * | 1/2005 | Robinson | B60T 13/74 303/7 |
| 7,114,786 B2 | 10/2006 | Bess et al. | |
| 7,126,801 B2 * | 10/2006 | Jokinen | H02H 11/003 361/85 |
| 8,344,541 B1 | 1/2013 | Li et al. | |
| 8,746,812 B2 | 6/2014 | Albright et al. | |

(Continued)

FOREIGN PATENT DOCUMENTS

EP 2963764 1/2016

OTHER PUBLICATIONS

Automotive-grade P-channel Power MOSFETs for Static, Dynamic and Repetitive Reverse Polarity Protection. Filippo Scrimizzi. pp. 1987-1991. May 2016.

(Continued)

*Primary Examiner* — Jared Fureman
*Assistant Examiner* — Lucy M Thomas

(57) ABSTRACT

A trailer brake module includes a brake output driver configured to be connected to a power supply, a flyback diode, and a MOSFET arranged between the power supply and the flyback diode. The MOSFET is in series with the flyback diode.

19 Claims, 4 Drawing Sheets

(56) References Cited

U.S. PATENT DOCUMENTS

2010/0283623 A1   11/2010  Baxter et al.
2015/0210232 A1*  7/2015   Kanzaki .................. H02H 7/18
                                                    701/36

OTHER PUBLICATIONS

Power Junction FETs (JFETs) for Very Low-Voltage Applications. Daniel Chang. pp. 1419-1423. Mar. 10, 2005.

* cited by examiner

TRAILER BATTERY REVERSE CONNECTION PROTECTION

CROSS-REFERENCE TO RELATED APPLICATIONS

This application claims the benefit of U.S. Provisional Patent Application No. 62/954,729 filed on Dec. 30, 2019 and is incorporated herein by reference.

BACKGROUND

The present disclosure relates to a trailer brake module.

Trailers are usually unpowered vehicles that are pulled by a powered tow vehicle. A trailer may be a utility trailer, a popup camper, a travel trailer, livestock trailer, flatbed trailer, enclosed car hauler, and boat trailer, among others. The tow vehicle may be a car, a crossover, a truck, a van, a sports-utility-vehicle (SUV), a recreational vehicle (RV), or any other vehicle configured to attach to the trailer and pull the trailer. The trailer may be attached to a powered vehicle using a trailer hitch. In addition to the mechanical connection between the trailer and the powered vehicle, in some examples, the trailer is electrically connected to the tow vehicle. As such, the electrical connection allows the trailer to take the feed from the powered vehicle's rear light circuit, allowing the trailer to have taillights, turn signals, and brake lights that are in sync with the powered vehicle's lights.

For some larger trailers, the trailer also may include a trailer brake system, which utilizes electronic brakes for the trailer. Trailer brake systems typically include a trailer brake module arranged on the tow vehicle that controls the current to the trailer brakes. These trailer brake systems often also have a separate battery installed in the trailer. If the trailer ever becomes detached from the tow vehicle, the battery powers the trailer brake system in order to safely slow and stop the trailer.

SUMMARY

In one exemplary embodiment, a trailer brake module includes a brake output driver configured to be connected to a power supply, a flyback diode, and a MOSFET arranged between the power supply and the flyback diode. The MOSFET is in series with the flyback diode.

In a further embodiment of any of the above, the trailer brake module is configured to be connected to a trailer brake system having a trailer battery.

In a further embodiment of any of the above, the brake output driver is connected to a microcontroller.

In a further embodiment of any of the above, a polarity detection circuit is connected to the microcontroller.

In a further embodiment of any of the above, the polarity detection circuit comprises a plurality of transistors and a plurality of resistors.

In a further embodiment of any of the above, the polarity detection circuit comprises a diode.

In a further embodiment of any of the above, the polarity detection circuit is configured to detect a fault due to reverse polarity of a battery and communicate the fault to the microcontroller.

In a further embodiment of any of the above, the trailer brake module includes a MOSFET gate control circuit.

In a further embodiment of any of the above, the MOSFET gate control circuit is configured to control the MOSFET.

In a further embodiment of any of the above, the MOSFET gate control circuit comprises two transistors that switch between voltage levels to control the MOSFET.

In a further embodiment of any of the above, the MOSFET is only ON when the brake output driver is operating.

In another exemplary embodiment, a trailer brake system includes a tow vehicle having a trailer brake module (TBM), and a trailer attached to the tow vehicle. The trailer has an electronic brake in communication with the trailer brake module. A trailer battery is arranged on the trailer, the trailer battery in communication with the electronic brake. The TBM comprises a MOSFET arranged in series with a flyback diode.

In a further embodiment of any of the above, the TBM comprises a brake output driver and a microcontroller.

In a further embodiment of any of the above, a polarity detection circuit is connected to the microcontroller.

In a further embodiment of any of the above, the polarity detection circuit comprises a diode, a plurality of transistors, and a plurality of resistors.

In a further embodiment of any of the above, the polarity detection circuit is configured to detect a fault due to reverse polarity and communicate the fault to the microcontroller.

In a further embodiment of any of the above, a MOSFET gate control circuit is configured to control the MOSFET.

In a further embodiment of any of the above, the MOSFET gate control circuit comprises two transistors that switch between voltage levels to control the MOSFET.

In a further embodiment of any of the above, the MOSFET is configured to protect the flyback diode from high current due to an improperly connected trailer battery.

In another exemplary embodiment, a method of preventing damage to a trailer brake module includes providing a trailer brake module configured to be in electronic communication with a trailer brake system, arranging a flyback diode in the trailer brake module, and arranging a MOSFET in series with the flyback diode.

BRIEF DESCRIPTION OF THE DRAWINGS

The disclosure can be further understood by reference to the following detailed description when considered in connection with the accompanying drawings wherein.

DETAILED DESCRIPTION

Figure 1:
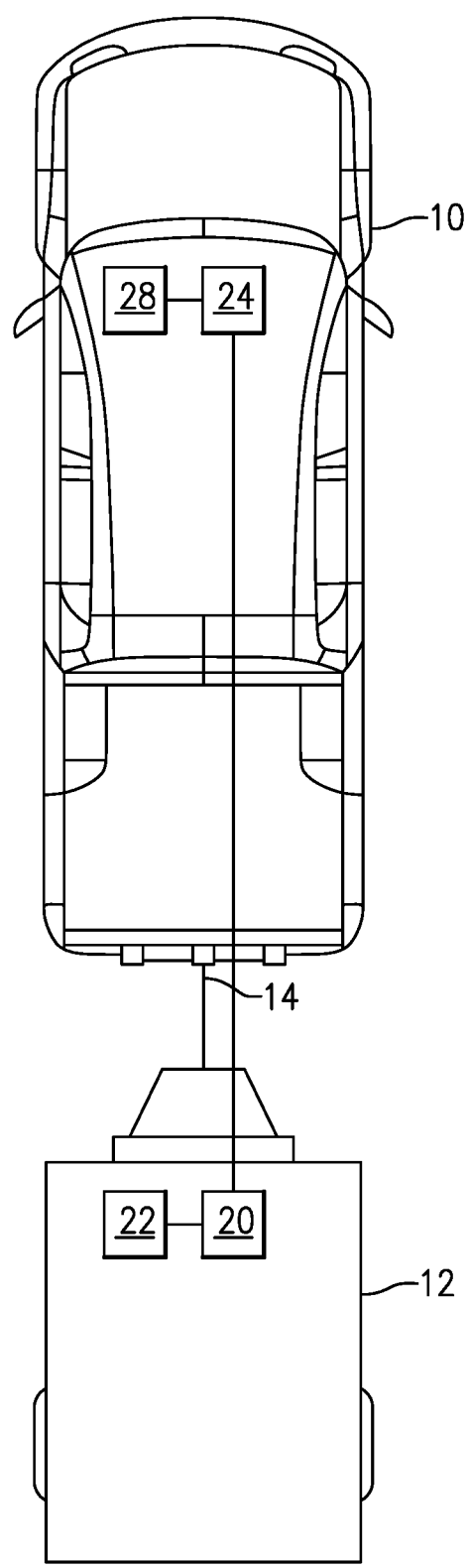
FIG. 1 schematically illustrates an example trailer attached to a tow vehicle.

FIG. 1 schematically illustrates a tow vehicle 10 that is attached to a trailer 12 at a hitch 14. A trailer brake system 20 is arranged on the trailer 12. The trailer brake system 20 may be an electronic brake for the trailer 12, for example. The trailer brake system 20 is connected to a trailer brake module (TBM) 24 within the cab of the vehicle 10. The trailer brake system 20 may be connected to the TBM 24 through the hitch 14, for example. The TBM 24 controls the trailer brake system 20. The TBM 24 may be connected to a power source 28 within the vehicle 10. The power source 28 may provide 12 volt power, for example. The trailer brake system 20 may be connected to a battery 22 on the trailer 12. When the connection to the TBM 24 is broken, the trailer brake system 20 receives power from the battery 22. For example, if the trailer 12 breaks away from the vehicle 10, a switch between the trailer brake system 20 and the battery 22 will be closed, and the trailer brake system 20 receives power from the battery 22 to safely stop the trailer 12.

Figure 2:
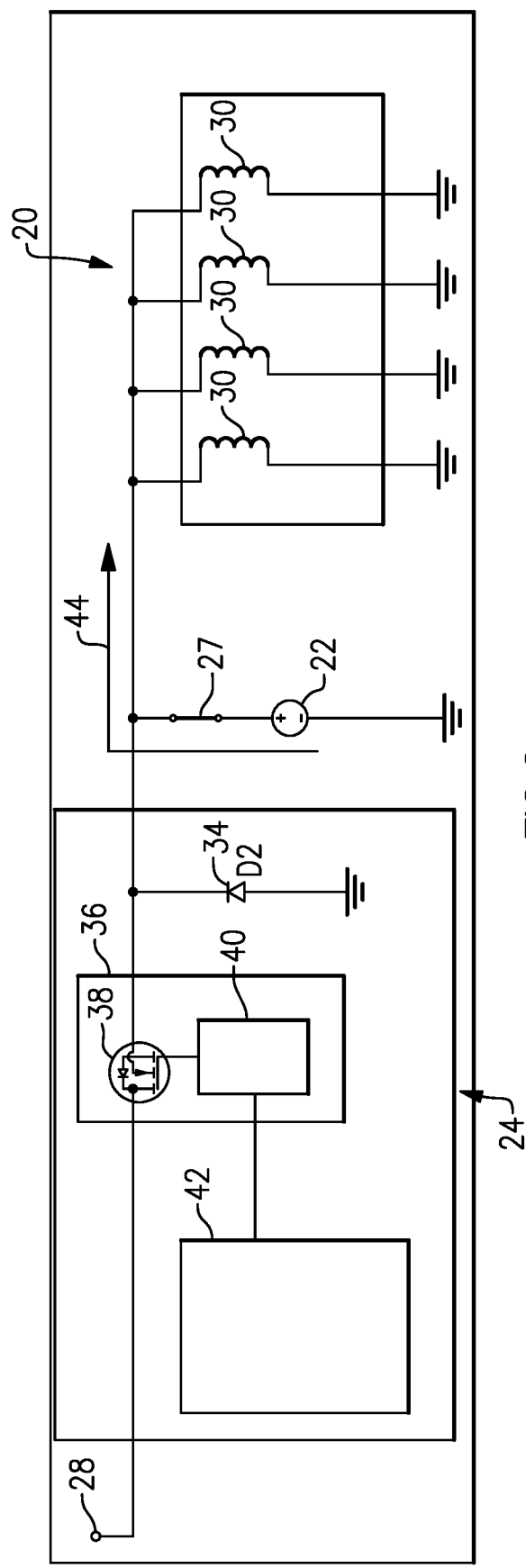
FIG. 2 illustrates an example circuit for a known trailer brake system in a disconnected state.

FIG. 2 illustrates an example known trailer brake system 20 and TBM 24. The trailer brake system 20 applies electric brakes to the trailer 12. The electric brakes on the trailer 12 are represented in the figures as an inductor 30 for each brake. The TBM 24 generally includes a microcontroller 42, a brake output driver 36, and a diode 34. The brake output driver 36 includes a gate 38 and driver gate control 40. In this example, the driver gate control 40 is in communication with the microcontroller 42, and the gate 38 is connected to the power source 28. The TBM 24 controls the high current to the trailer brake system 20 by switching ON and OFF at a rapid rate. When the TBM 24 is switched off, high negative voltage spikes can appear on the brake output driver 36. The diode 34 is provided between the output of the driver 36 and ground. The diode 34 may be a flyback diode. When the trailer brake system 20 is switched OFF, there is stored energy in the inductive elements 30, resulting in high voltage. The flyback diode 34 provides a dissipation path for this stored flyback energy. The flyback diode 34 thus protects the brake output driver 36 from high voltage created from a large flow of current when the trailer brake system 20 is switched off.

In this illustrated example, the trailer brake system 20 is disconnected from the TBM 24. A trailer battery switch 27 is closed, and thus, current 44 flows from the battery 22 to the brake system 20 to stop the trailer 12. However, when the battery 22 is installed incorrectly, i.e., with reverse polarity, the system does not work as intended.

Figure 3:
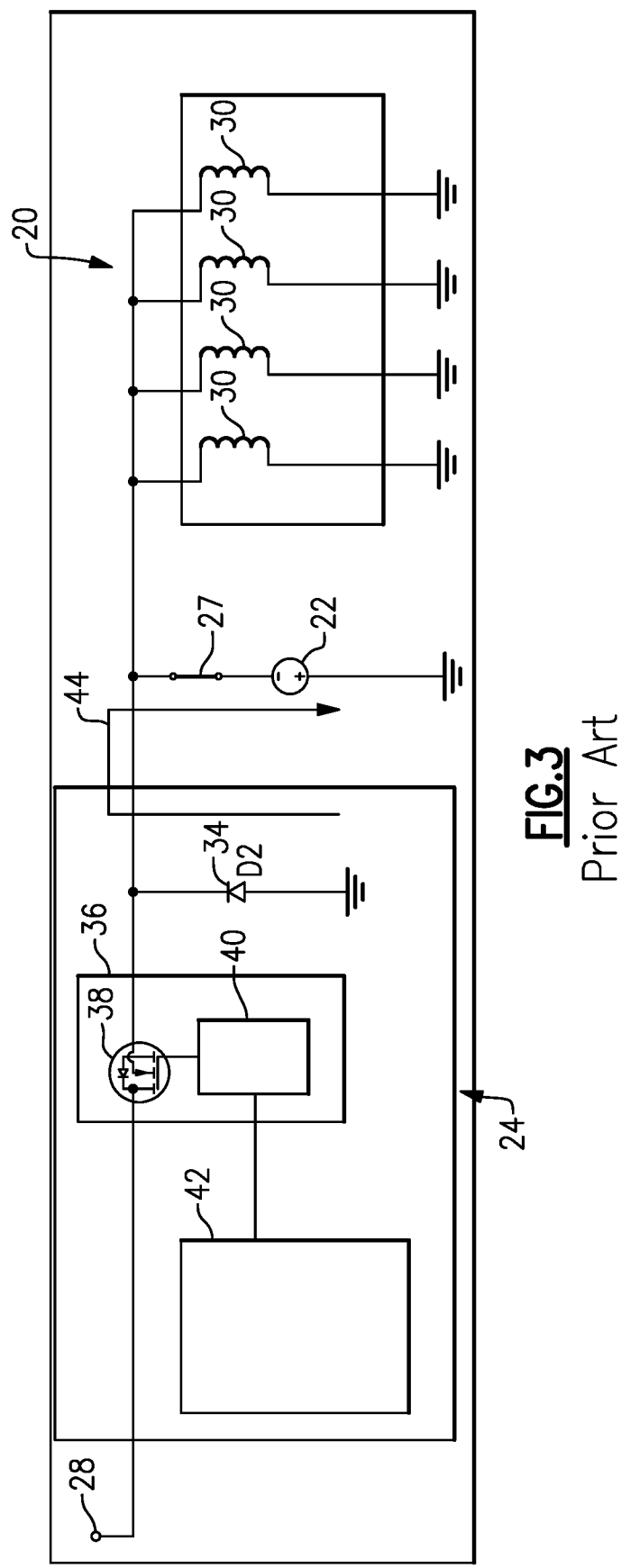
FIG. 3 illustrates the example circuit of FIG. 2 in a connected state.

FIG. 3 illustrates the example trailer brake system 20 and TBM 24 of FIG. 2, with the trailer 12 connected to the tow vehicle 10. In this example, the battery 22 is installed with the polarization reversed. That is, the battery 22 is installed incorrectly. In this example, the trailer brake system 20 and TBM 24 are connected, and the trailer battery 22 is connected at the switch 27. This might occur when an operator is testing the trailer brake system 20, for example. Typical circuit configurations would not easily detect that the battery 22 was installed with the polarization reversed. Since the battery 22 is installed backwards, the current 44 flows into the battery 22. This can cause high current flow that may damage the flyback diode 34.

The disclosed trailer brake system includes a trailer brake module (TBM) that is configured to prevent damage to the TBM in the event the trailer battery is installed incorrectly. The TBM utilizes a blocking MOSFET to protect the flyback diode when a trailer battery is installed with reverse polarity.

Figure 4:
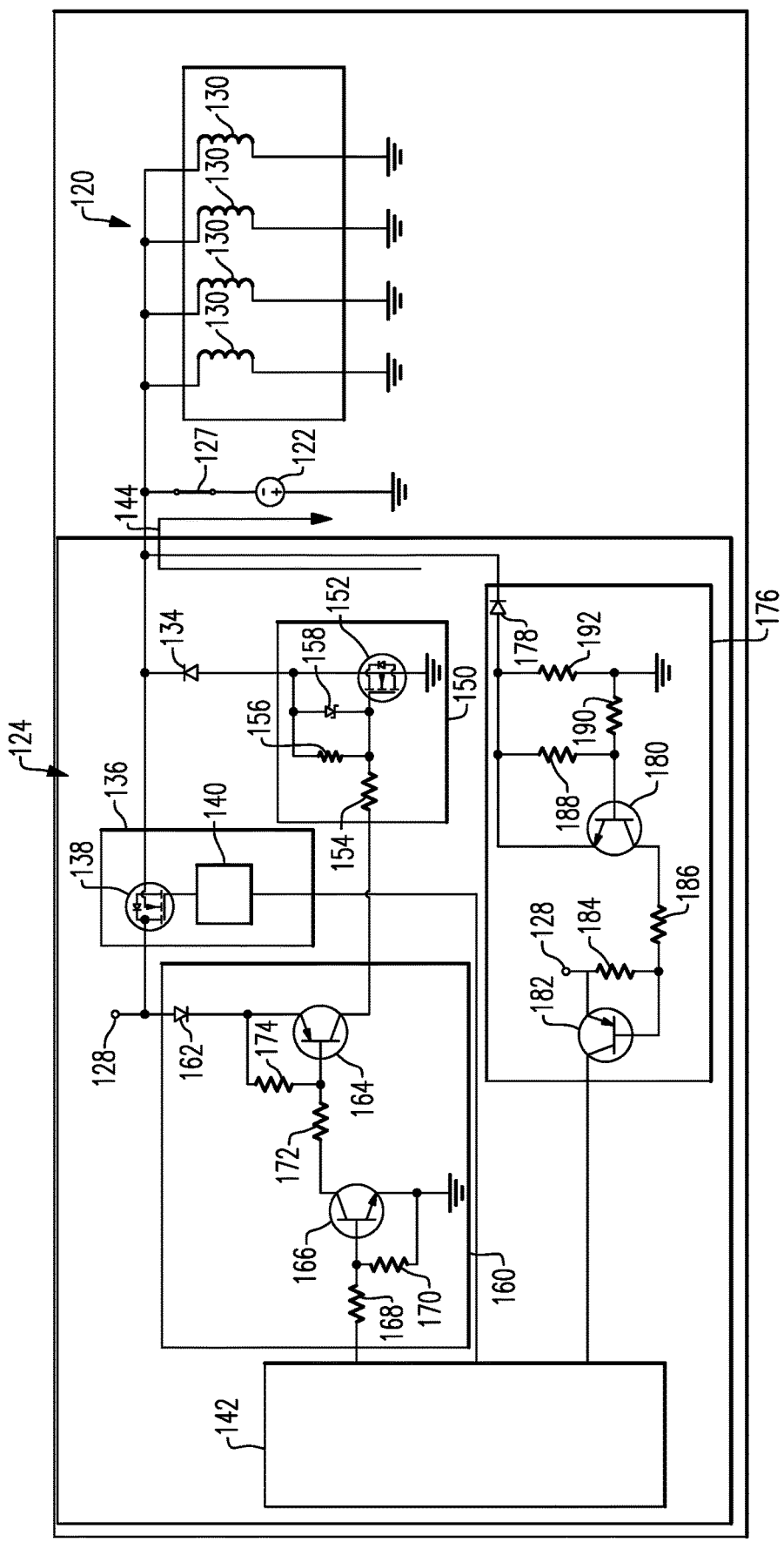
FIG. 4 illustrates an example circuit for a trailer brake system according to an example embodiment.

FIG. 4 illustrates an example circuit for a trailer brake system according to an example embodiment. This example circuit provides protection to the components in case the battery 122 is installed with reverse polarity. To the extent not otherwise described or shown, the reference numerals in FIG. 4 generally correspond to those of FIG. 2, with like parts having reference numerals prepended with a "1." This example includes a blocking MOSFET 150 arranged in series with the flyback diode 134. The MOSFET 150 protects the flyback diode 134 in case the battery 122 is installed with reversed polarity. The MOSFET 150 is controlled by the microcontroller 142 of the TBM 124. An output polarity detection circuit 176 detects the voltage polarity of the output. If the voltage polarity is detected to be negative, the microcontroller 142 maintains the MOSFET in an OFF state. Otherwise, the MOSFET is activated, allowing a recirculating current path through the flyback diode 134. Thus, for negative polarity at output, the MOSFET 150 protects the high current diode 134.

The blocking MOSFET 150 generally includes a gate 152 and resistors 154, 156. The blocking MOSFET 150 is ON only during operation of the brake output driver 136. The blocking MOSFET 150 prevents high current from flowing through the flyback diode 134 if trailer battery polarity is reversed, preventing damage to the diode 134. The TBM 124 further includes a MOSFET gate control circuit 160 and an output polarity detection circuit 176, which control the MOSFET 150.

The output polarity detection circuit 176 is connected to the microcontroller 142. The output polarity detection circuit 176 generally includes a diode 178, a plurality of transistors 180, 182, and a plurality of resistors 184, 186, 188, 190, 192. When a user has connected the trailer battery 122 with polarity reversed, and the trailer disconnect switch 127 is closed, the blocking MOSFET 150 will protect the flyback diode 134. In this situation, a small current will be drawn through the diode 178 and the switch 127 into the trailer battery 122. This small current passing through the diode 178 will pass through resistors 188, 190, 192, activating the transistor 180. The transistor 180 in turn activates the transistor 182 through resistors 184, 186, providing a feedback signal to the microcontroller 142. The feedback signal to the microcontroller 142 indicates that the trailer battery 122 is installed with reverse polarity, causing a trailer battery fault condition. The fault condition causes the microcontroller to maintain that the blocking MOSFET 150 remains in the OFF state, protecting the flyback diode 134 from damaging current.

The MOSFET gate control circuit 160 is arranged between the power source 128 and the blocking MOSFET 150. The MOSFET gate control circuit 160 generally includes a diode 162, a plurality of transistors 164, 166, and a plurality of resistors 168, 170, 172, 174. During normal operation, the microcontroller 142 verifies the output state is correct from the transistor 182 in the polarity detection circuit 176. The MOSFET gate control circuit 160 then only activates the blocking MOSFET 150 through transistors 166, 164 when the brake output driver 136 is operating. The transistors 164, 166 control the MOSFET 150 by switching between voltages. For example, the MOSFET gate control circuit 160 may switch between 0 volts and 12 volts to control the MOSFET 150.

The disclosed example system provides protection to the TBM 24 by using a MOSFET 150 to protect the diode 134. The MOSFET 150 is only turned ON during normal braking events, i.e., when the brake output driver 136 is operating. The detection circuit 176 determines when a fault condition occurs, such as the battery installed with reverse polarity, allowing the microcontroller 142 to prevent damage to the output circuit and provide diagnostic information to the user.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A trailer brake module, comprising:
   a brake output driver configured to be connected to a power supply comprised in a tow vehicle;
   a flyback diode comprised in the tow vehicle; and
   a MOSFET arranged in the tow vehicle between the power supply and the flyback diode, the MOSFET in series with the flyback diode and configured to protect the flyback diode from high current due to reverse polarity of a trailer battery.

2. The trailer brake module of claim 1, wherein the trailer brake module is configured to be connected to a trailer brake system having the trailer battery.

3. The trailer brake module of claim 1, wherein the brake output driver is connected to a microcontroller.

4. The trailer brake module of claim 3, wherein a polarity detection circuit is connected to the microcontroller.

5. The trailer brake module of claim 4, wherein the polarity detection circuit comprises a plurality of transistors and a plurality of resistors.

6. The trailer brake module of claim 5, wherein the polarity detection circuit comprises a diode.

7. The trailer brake module of claim 4, wherein the polarity detection circuit is configured to detect a fault due to the reverse polarity of the trailer battery and communicate the fault to the microcontroller.

8. The trailer brake module of claim 1, comprising a MOSFET gate control circuit.

9. The trailer brake module of claim 8, wherein the MOSFET gate control circuit is configured to control the MOSFET.

10. The trailer brake module of claim 8, wherein the MOSFET gate control circuit comprises two transistors that switch between voltage levels to control the MOSFET.

11. The trailer brake module of claim 1, wherein the MOSFET is only ON when the brake output driver is operating.

12. A trailer brake system, comprising:
    a tow vehicle having a trailer brake module (TBM);
    a trailer attached to the tow vehicle, the trailer having an electronic brake in communication with the trailer brake module;
    a trailer battery arranged on the trailer, the trailer battery in communication with the electronic brake;
    wherein the TBM comprises a MOSFET arranged in series with a flyback diode, the MOSFET configured to protect the flyback diode from high current due to reverse polarity of the trailer battery.

13. The trailer brake system of claim 12, wherein the TBM comprises a brake output driver and a microcontroller.

14. The trailer brake system of claim 13, wherein a polarity detection circuit is connected to the microcontroller.

15. The trailer brake system of claim 14, wherein the polarity detection circuit comprises a diode, a plurality of transistors, and a plurality of resistors.

16. The trailer brake system of claim 15, wherein the polarity detection circuit is configured to detect a fault due to reverse polarity of the trailer battery and communicate the fault to the microcontroller.

17. The trailer brake system of claim 12, comprising a MOSFET gate control circuit configured to control the MOSFET.

18. The trailer brake system of claim 17, wherein the MOSFET gate control circuit comprises two transistors that switch between voltage levels to control the MOSFET.

19. A method of preventing damage to a trailer brake module, comprising:
    providing a trailer brake module configured to be comprised in a tow vehicle and to be in electronic communication with a trailer brake system;
    arranging a flyback diode in the trailer brake module; and
    arranging a MOSFET in series with the flyback diode, the MOSFET configured to protect the flyback diode from high current due to reverse polarity of a trailer battery.

* * * * *